United States Patent
Lakhotkin et al.

(10) Patent No.: US 6,800,383 B1
(45) Date of Patent: Oct. 5, 2004

(54) TUNGSTEN CARBIDE COATING AND METHOD FOR PRODUCING THE SAME

(75) Inventors: Jury V. Lakhotkin, Moscow (RU); Vladimir P. Kuzman, Moscow (RU)

(73) Assignee: Hardide Limited (GB)

( * ) Notice: Subject to any disclaimer, the term of this patent is extended or adjusted under 35 U.S.C. 154(b) by 0 days.

(21) Appl. No.: 09/913,324

(22) PCT Filed: Feb. 11, 1999

(86) PCT No.: PCT/RU99/00037
§ 371 (c)(1),
(2), (4) Date: Dec. 3, 2001

(87) PCT Pub. No.: WO00/47796
PCT Pub. Date: Aug. 17, 2000

(51) Int. Cl.$^7$ .......................... B23B 15/00; C23C 16/32
(52) U.S. Cl. .......................... 428/698; 91/307; 91/309; 427/255.1; 427/255.2; 427/255.7; 428/216; 428/332; 428/469; 428/472
(58) Field of Search ................ 51/307, 309; 427/255.1, 427/255.2, 255.7; 428/216, 332, 469, 412, 698

(56) References Cited

U.S. PATENT DOCUMENTS

| | | | |
|---|---|---|---|
| 3,368,914 A | * | 2/1968 | Darnell et al. |
| 3,389,977 A | * | 6/1968 | Tarver |
| 4,874,642 A | | 10/1989 | Garg et al. ................ 427/249 |
| 4,945,640 A | * | 8/1990 | Garg et al. |
| 4,980,201 A | | 12/1990 | Tokunaga et al. ........... 427/249 |
| 5,006,371 A | | 4/1991 | Garg et al. ................ 427/249 |
| 5,145,739 A | * | 9/1992 | Sarin |
| 5,635,548 A | | 6/1997 | Kittle et al. ................ 523/220 |

FOREIGN PATENT DOCUMENTS

| | | | |
|---|---|---|---|
| DE | 3907603 | | 9/1989 |
| GB | 2179678 | * | 3/1987 |
| JP | 55024803 | | 2/1980 |
| JP | 61084375 | | 4/1986 |
| JP | 61157681 | | 7/1986 |
| JP | 02097678 | * | 4/1990 |
| JP | 04254585 | * | 9/1992 |
| JP | 06 173009 | * | 6/1994 |
| RU | 2106429 | | 3/1998 |
| WO | WO 94/11446 | | 5/1994 |

* cited by examiner

*Primary Examiner*—Archene Turner
(74) *Attorney, Agent, or Firm*—Sheridan Ross P.C.

(57) ABSTRACT

New tungsten carbides alloyed with fluorine in amounts up to 0.5 wt % and possibly with fluorocarbon compositions are described. It is possible to produce them by means of a new process of chemical vapor deposition, in which tungsten hexafluoride, hydrogen and a carbon-containing gas are used. A specific feature of the new process is the preliminary thermal activation of the carbon-containing gas. The tungsten carbide coatings are deposited on construction materials and items made from them. They possess enhanced resistance to wear, corrosion and chemicals.

121 Claims, No Drawings

TUNGSTEN CARBIDE COATING AND METHOD FOR PRODUCING THE SAME

TECHNOLOGY FIELD

The invention is related to the technology of the deposition of composite surface systems possessing high resistance to wear, erosion and chemicals. More specifically, the invention is related to the technology of the deposition of coatings containing tungsten carbides and mixtures of them with each other and with tungsten or free carbon.

Superhard erosion and corrosion resistant coatings, including those containing tungsten carbides, are widely used in manufacturing various articles of tools in present-day mechanical engineering. Such coatings possess high resistance to erosion, chemicals and wear, and thus substantially increase the life of mechanical engineering products and of tools operated under demanding conditions.

PRIOR ART

Patent GB 2 179 678 describes a surface composite system with high resistance to wear and erosion consisting of a mixture of tungsten (for plasticity) and tungsten carbide $W_2C$ (for hardness). These hard coatings made from a fine-grain mixture of tungsten carbide with metallic tungsten were obtained by means of physical vapour deposition (PVD) by spraying tungsten and carbon from separate sources. The tungsten and carbon are condensed on different-type substrates to form the said alloys of tungsten with tungsten carbide.

However, the rate of synthesis of tungsten carbides is very low, and internal stresses in the coatings increase sharply as the tungsten-carbon layer grows, resulting in delamination of the coatings. For this reason, it is impossible to produce sufficiently thick coatings by the PVD method. Furthermore, the physical vapour deposition method is intrinsically inapplicable for deposition of coatings on items of complex shape due to the impossibility of depositing the coatings on the parts of the item shadowed relative to the incident beam.

The chemical vapour deposition process (CVD) eliminates these disadvantages. The CVD process can be used to deposit wear and erosion resistant coatings on substrates and on items of complex shape.

In a typical CVD process for the deposition of composite coatings, the substrate is heated in the reaction chamber, and the previously mixed gas reagents are then introduced into this chamber. By varying the composition of the reaction mixture and of the parameters of the process (temperature of the substrate, composition of the reaction mixture, flow rate, total pressure in the reaction mixture, temperature of the gases supplied, etc.), it is possible to obtain a variety of coatings.

Among the CVD methods of tungsten carbide coating deposition, only the fluoride method makes it possible to form tungsten carbides of high quality at a low temperature. For this purpose, one may use thermal decomposition of a mixture of tungsten hexafluoride, hydrogen and carbon-containing gas in the CVD process.

Various reagents were used as carbon-containing gases, e.g. dimethylether, amines, propylene, etc., with the aid of which one may synthesise tungsten carbide of one or two compositions.

For example, the thermal decomposition of dimethylether (DME) (EP 0 328 084 B1) results in the formation of the mixture $W+W_3C$; $W+W_2C+W_3C$; $W+W_2C$ in the form of bilaminar coatings. The internal tungsten layer of the coating is obtained from the as mixture $WF_6$ (0.3 l/min), $H_2$ (3 l/min), Ar (4.0 l/min) at 460° C. The external layer containing a mixture of tungsten with $W_3C$ is obtained from a mixture of $WF_6$ (0.3 l/min), $H_2$ (3 l/min) and DME (0.4 l/min) at 460° C. at a total pressure of 40 torr. The external coating $W+W_2C$ is obtained from a mixture of $WF_6$ (0.3 l/min) and DME (0.55 l/min) at 460° C. at a total pressure of 40 torr. The external coating $W+W_2C$ is obtained from a mixture of $WF_6$ (0.3 l/min), Ar (4.5 l/min) and DME (0.85 l/min) at 460° C. and a total pressure of 40 torr.

Patent JP 9113527 A 19910204 describes how tungsten carbide WC is obtained from a gaseous mixture of $WF_6$, $H_2$ and amines with an atomic ratio of C to N equal to 1:20 and H to W equal to 1:15 at 400–900° C. The patent cites the production of WC from the mixture $WF_6$:trimethylamine:$H_2$=1:2:3 (the atomic ratios are C/W=6.0, H/W=6.0). The flow rate is 120 cm³/min at 800° C. and the total pressure is equal to atmospheric. A 70 μm layer forms in 30 minutes.

Patent JP 8857301 A 19880310 describes how a $W_3C$ coating on an aluminium substrate is obtained from a gaseous mixture of $WF_6$, $H_2$ and aromatic hydrocarbon with atomic ratios C/W equal to 2–10 and H/C exceeding 3 at temperature 250–500° C.

Patent JP 84280063 A 19841228 describes how a $W_2C$ coating on a graphite substrate is obtained from a gaseous mixture of $WF_6$, $C_3H_6$ and $H_2$ with inert gas. The preferred regime:mixture $WF_6$:$H_2$=1:3–1:15 with an admixture of $C_3H_6$ in the reaction mixture with molar ratio 0.01–0.3; the temperature of the substrate is 350–600° C.

Patent JP 84204563 A 19840929 describes how a $W_2C$ coating is obtained from a gaseous mixture of $WF_6$, $H_2$ (molar ratio $WF_6$:$H_2$=1:3–1.15) and cyclopropane with molar ratio in the mixture 0.01–0.3 at a substrate temperature of 350–600° C. The example cited is the manufacturing of a $W_2C$ coating on a copper substrate from the mixture $WF_6$: 40, $H_2$: 320, Ar: 40, $C_3H_8$: 10 cm³/min at 500° C. with a growth rate of 3.3 μm/min.

EP A 0 305 917 describes how super-hard fine-grain non-columnar laminar tungsten-carbon alloys are obtained by chemical vapour deposition. The described alloys contain carbide phases consisting of $W_2C$ or $W_3C$ or mixtures of them with each other. It is demonstrated that these tungsten carbon alloys, when deposited on certain types of substrate, have a net of very fine micro-cracks all over the deposit. Coatings made from these alloys have inadequate resistance to wear and erosion.

EP 0 411 646 A1 describes a multilayer coating containing alternating layers of tungsten and a mixture of tungsten with tungsten carbides in the form of $W_2C$, $W_3C$ or a mixture of them. It is demonstrated that such a coating increases the resistance of the material to wear and erosion. It is known, however, that the maximum composition effect is observed for layers with a distinct boundary between them. This is obviously not the case for the conjunction of layers of tungsten and the mixture of tungsten with tungsten carbide which is characteristic of this patent.

SUBSTANCE OF THE INVENTION

It follows from the patents cited above that different reagents and different technologies are used for the production of different types of tungsten carbides. In this connection, the main aim of this invention is to develop a universal technology making it possible to obtain all the known carbides, mixtures of them and also new carbides.

Furthermore, the problem of increasing the hardness of tungsten carbide coatings remains very important, because such key parameters as strength and wear resistance are related specifically to hardness.

A solution to these and other problems is provided by this invention, due to the development of a new method for the production of tungsten carbides and mixtures of them. The main distinguishing feature of the method is the preliminary thermal activation of the hydrocarbons used in the CVD process. The synthesis of a tungsten carbide layer of a certain composition depends on an activation temperature that varies from 500 to 850° C., on a total pressure in the reactor that varies from 2 to 150 kPa, and on the partial pressure of the hydrocarbon reagent.

Preliminary activation of the hydrocarbons results in the formation of the necessary concentration of hydrocarbon radicals and their associates with fluorine in the gaseous phase over a wide range. The proposed method makes it possible to alloy the carbides and/or mixtures of them with fluorine and fluoride-carbon compositions. Fluorine, as the most active chemical element, strengthens the interatomic bonds when it penetrates into the carbide lattice. It is the strengthening of the interatomic bonds in the carbide which produces the increase in hardness. This process is similar to the formation of oxycarbide phases instead of purely carbide structures. On the other hand, fluorine stabilises the structure of the low-temperature phases (tungsten subcarbides) due to the high energy of the fluorine-carbon bond.

Along with fluorine as an element, fluorine-carbon compounds with carbon content up to 15 wt % and fluorine content up to 0.5 wt % can be introduced into the composition of the tungsten carbide. These admixtures have two roles: firstly, they increase the hardness of the tungsten carbides; and secondly, they stabilise the structure of the tungsten subcarbides. Thus, the introduction of fluorine and fluorine-carbon admixtures makes it possible to obtain such tungsten carbides as monocarbide WC, semicarbide $W_2C$ and subcarbides $W_3C$ and $W_{12}C$.

The application of the new tungsten carbides makes it possible to manufacture a bilaminar coating, the internal layer of which (deposited on the substrate—a construction material or items made of it) is composed of tungsten. The external layer contains tungsten carbide alloyed with fluorine and possibly with fluorine-carbon compositions, or mixtures of such carbides with each other and also with tungsten and free carbon.

The construction material with the deposited composition coating has an internal tungsten layer of thickness 0.5–300 $\mu$m. The thickness of the external layer is 0.5–300 $\mu$m. The ratio of thicknesses of the internal and external layers ranges from 1:1 to 1:600.

In accordance with this invention, tungsten carbides are deposited in the chemical reactor on the substrate from a gaseous phase consisting of tungsten hexafluoride, hydrogen, a carbon-containing gas (e.g. propane), and, optionally, an inert gas (e.g. argon). The carbon-containing gas is thermally activated before being introduced into the reactor by heating it to 500–850° C. The pressure in the reactor ranges from 2 to 150 kPa. The substrate is heated to temperature 400–900° C. The ratio of carbon-containing gas to hydrogen ranges from 0.2 to 1.7, and the ratio of tungsten hexafluoride to hydrogen ranges from 0.02 to 0.12.

Within the stated limits, the parameters of the process are determined depending on which carbide or mixture of carbide with each other or with tungsten or with carbon is required to be produced. Thus, to produce tungsten monocarbide WC, the preliminary thermal activation of the carbon-containing gas is conducted at a temperature of 750–850° C. The ratio of propane to hydrogen is set in the interval 1.00–1.50, and the ratio of tungsten to hydrogen in the interval 0.08–0.10.

The corresponding parameters for the production of single-phase tungsten semicarbide $W_2C$ are as follows: 600–750° C., 0.75–0.90 and 0.06–0.08. The parameters for the production of tungsten subcarbide $W_3C$ are: 560–720° C., 0.60–0.65 and 0.050–0.055.

A previously unknown tungsten subcarbide, $W_{12}C$, with hardness 3500 kG/mm$^2$, greater than that of any of the known carbides, was obtained by the method proposed in this invention. For the production of this subcarbide, propane was thermally activated at temperature 500–700° C. The ratio of propane to hydrogen was within the interval 0.35–0.40 and that of tungsten hexafluoride to hydrogen was 0.040–0.045.

This process makes it possible to obtain mixtures of tungsten carbides and mixtures of the carbides with free tungsten and carbon. The values of the parameters for these cases are shown in Table 1.

TABLE 1

| No. | Composition | Propane activation temperature ° C. | Propane to hydrogen ratio | Tungsten hexafluoride to hydrogen ratio |
|---|---|---|---|---|
| 1. | $WC + W_2C$ | 670–790 | 0.90–1.00 | 0.07–0.09 |
| 2. | $W_2C + W_3C$ | 580–730 | 0.70–0.75 | 0.055–0.060 |
| 3. | $W_2C + W_{12}C$ | 570–700 | 0.60–0.65 | 0.045–0.060 |
| 4. | $W_3C + W_{12}C$ | 550–680 | 0.40–0.60 | 0.045–0.050 |
| 5. | $W_2C + W_3C + W_{12}C$ | 570–710 | 0.65–0.70 | 0.045–0.060 |
| 6. | $WC + W$ | 600–720 | 0.70–0.90 | 0.08–0.09 |
| 7. | $W_2C + W$ | 600–720 | 0.70–0.90 | 0.08–0.09 |
| 8. | $W_3C + W$ | 560–700 | 0.60–0.65 | 0.055–0.070 |
| 9. | $W_{12}C + W$ | 500–680 | 0.20–0.35 | 0.045–0.070 |
| 10. | $W_3C + W_{12}C + W$ | 500–680 | 0.35–0.60 | 0.05–0.07 |
| 11. | $WC + C$ | 750–850 | 1.50–1.70 | 0.10–0.12 |

As mentioned above, control of the content of active hydrocarbon radicals within wide limits is provided by means of the preliminary thermal activation of the initial carbon-containing reagent. This makes it possible to form carbide phases and mixtures of them with free carbon content of up to 15 wt %. The thermal activation of the carbon-containing reagent takes place in a hydrofluoric atmosphere, which provides additional formation of fluorine-carbon radicals. Radicals of both types take part in alloying the carbide phases and mixtures of them with fluorine and carbon, producing an increase in their hardness and enhanced tribotechnical properties.

Internal stresses increase slowly as the coatings of single-phase tungsten carbides grow; thus, high wear resistance is observed even with quite thick coatings (up to 300 µm). Their chemical resistance and high hardness are due to the strong interatomic bonds in the carbide lattice and the absence of free tungsten.

In order to bring about a microplastic effect in the coatings, one can use mixtures of carbides with each other and mixtures of them with tungsten and free carbon, in this case losing some chemical and electrochemical stability. Note that coatings of tungsten carbide with free carbon have a reduced friction coefficient in addition to the said microplastic effect. This is very important where mixtures of carbides with free carbon are used as wear-resistant tribotechnical coatings in friction assemblies.

By using the proposed invention and also the described new method of coating deposition, one can also obtain multilayer coatings with alternating layers of tungsten and layers containing tungsten carbides alloyed with fluorine and possibly with fluorocarbon compositions, including mixtures of these carbides with each other and with tungsten or carbon. The ratio of thicknesses of the alternating layers ranges from 1:1 to 1:5.

The construction material itself, with a bilaminar or multilayer coating deposited in accordance with the proposed method, is also an object of this invention.

EXAMPLES

Although the possibility of the application of the tungsten carbides obtained in accordance with the proposed invention on their own is not excluded, priority in their application is given to the deposition of these carbides as wear-resistant coatings on construction materials and items made of them. That is why the examples given below illustrate the invention specifically in cases of the deposition of carbides on substrates as coatings. However, these examples do not restrict the invention, because, for example, one can obtain other combinations of tungsten carbides with each other and/or tungsten and/or carbon.

The examples given illustrate the production of complex coatings in which the layer of coating containing this or that tungsten carbide or mixtures of the carbides with each other and with tungsten and carbon is superimposed on a tungsten layer previously deposited on the substrate. The examples cover bilaminar coatings (internal layer of tungsten and external layer containing one or more tungsten carbides), and multilayer coatings with alternating layers of tungsten and layers containing tungsten carbides.

The construction material on which the composite coating is deposited (or its external layer relative to the coating, in the case of bimetal) contains one of the following base materials: hard alloys (cemented carbide), ceramics such as silicon carbide, silicon nitride, aluminium oxide, zirconium oxide, carbon-carbon composition materials etc., several iron-containing alloys such as iron, carbon steels, stainless steels, tool and high-speed steels and cast iron, or other materials from the following list: copper, silver, gold, cobalt, nickel, rhodium, rhenium, platinum, iridium, silicon, tantalum, niobium, vanadium, tungsten, molybdenum, carbon, nitrogen, boron, their alloys, compounds and mixtures, and also titanium alloys. The construction material or its outer layer adjacent to the coating should preferably consist of alloys with a nickel content exceeding 25 wt % e.g. Invar, Nichrome, Monel etc.

In the case of deposition onto chemically active materials such as iron, carbon steels, stainless steels, tool and high-speed steels, cast iron, titanium alloys and hard alloys (cemented carbide) containing titanium, it is preferable to deposit intermediate coatings containing materials chemically resistant to hydrogen fluoride, from the following list: copper, silver, gold, cobalt, nickel, rhodium, rhenium, platinum, iridium, tantalum, molybdenum, niobium, vanadium and boron. An intermediate coating of thickness 0.5–20 µm is deposited by electrochemical or chemical deposition from aqueous solutions, melt electrolysis, chemical or physical vapour deposition (e.g. by means of magnetron spraying) or by other methods.

The intermediate coatings thus obtained must be heat-treated at temperature 400–900° C. for 0.5–1 hours in a flow of hydrogen or inert gas.

In the case of deposition onto materials chemically resistant to hydrogen fluoride, such as copper, silver, gold, cobalt, nickel, rhodium, rhenium, platinum, iridium, tantalum, molybdenum, tungsten, niobium, graphite, carbides or ceramics, intermediate coatings are not deposited. Various items of complex shape made from the material of the proposed composite coatings are manufactured by means of its deposition onto copper, silver, gold, cobalt, nickel, rhodium, rhenium, platinum, iridium, tantalum, molybdenum, tungsten, niobium or graphite, with subsequent removal of the substrate by chemical or electrochemical pickling or by other methods.

The substrates, degreased and free of contaminations, are put inside a direct-flow chemical reactor with an electric heater. The chemical reactor is evacuated by means of a roughing pump with a liquid nitrogen freezing trap up to maximum vacuum, after which hydrogen or argon is supplied to the reactor. The reactor with the items in it is then heated to the required temperature, which is maintained for 0.5–1 hours. After this, the required hydrogen flow rate and total pressure in the reactor are set. The required flow rate of tungsten hexafluoride, heated beforehand to 30° C., is then set. After the retention of the items in the set conditions for the time necessary for the application of the internal tungsten layer, the required total pressure is set and a certain flow rate of the carbon-containing gas (e.g. propane), previously heated to the required temperature, into the reaction mixture is set. A multilayer composition coating is obtained by repeating the operation. After that, the supply of gas is terminated and the substrates are kept at constant temperature for 0.5–1 hours. After this stage, the temperature of the reactor is decreased to room temperature with hydrogen or argon being continuously supplied. The supply of hydrogen or argon is then terminated, the reactor is evacuated to maximum vacuum, and air is then admitted to it. The substrates with composite coatings are then removed from the reactor. Specific examples of the described method of deposition of a composite coating are described below. The tests for hardness and for determining the phase composition of the coating were carried out in the following manner.

Hardness Tests

Hardness tests were conducted using a PMT-3 instrument. Samples made from steel or hard alloys (cemented carbide) with the composite coating applied were cut across. The cut was then ground with emery cloth and polished with diamond paste to maximum smoothness. The microhardness of the coatings was determined by pressing the pyramid-shaped diamond micro-indenter of the PMT-3 instrument into the middle of the external or internal layer of the composite coating at the polished cross-cut of the sample. The results were averaged over 7–10 measurements. It was determined from them that the microhardness of the internal tungsten layer was 350–600 kG/mm², the microhardness of tungsten monocarbide (WC) was 1900 kG/mm², the microhardness of tungsten semicarbide ($W_2C$) was 3000 kG/mm² and the mirohardness of tungsten subcarbide $W_3C$ was 3100 kG/mm². The new tungsten subcarbide $W_{12}C$ possesses the greatest microhardness—3500 kG/mm². Mixtures of tungsten carbides have intermediate hardness values.

Multilayer coatings possessed medium hardness. In this case, the force on the diamond pyramid was selected so that the imprint extended into not less than four layers of the multilayer coating. These hardness measurements were also repeated 7–10 times.

Determining the Phase Composition of the Composite Coating

The phase composition of the deposits was determined by means of X-ray and electron diffraction methods. X-ray studies were carried out using a DRON-3 diffractometer, with the use of copper radiation on flat samples of size 10×10 mm. Qualitative phase analysis of the phases W, WC, $W_2C$, $W_3C$, $W_{12}C$ and C was carried out by identifying the reflection lines, using ASTM data. The study of the phase content of the compositions of tungsten carbides with free carbon was also carried out using illuminating electron microscopy. Furthermore, the determining of the phase content was supplemented by the chemical analysis of the total content of tungsten, carbon and fluorine. For this purpose, the external layer of the coating was removed from the copper substrate by dissolving the substrate in nitric acid and crushing the remaining coating substance. Its composition was then determined by analytical chemistry methods.

Example 1

A sample made from carbon steel (Steel 3 in the Russian classification) with a layer of nickel of thickness 8 µm deposited on it by the electrochemical method is retained in a furnace at temperature 900° C. in a medium of tungsten hexafluoride ($WF_6$) and hydrogen ($H_2$) at ratio 0.12 for 5 min and then in a medium of $WF_6$, $H_2$ and propane ($C_3H_8$) at a ratio of $WF_6$ to $H_2$ equal to 0.12 and a ratio of $C_3H_8$ to $H_2$ equal to 1.8 for 60 min; the $C_3H_8$ is thermally activated beforehand at 850° C. and the reaction mixture pressure is 2 kPa.

The material obtained with Steel 3 as the base material has an intermediate 8-µm-thick nickel layer and a composite coating with an internal tungsten (W) layer of thickness 5 µm and an external layer (mixture of WC and free carbon [carbon black]) of thickness 40 µm. The microhardness of the coating is 840 kG/mm². The coating has coarse inclusions of carbon black.

Example 2

A sample made from stainless steel (Kh18N10T) with a layer of nickel of thickness 10 µm deposited on it by the electrochemical method is retained in a furnace at temperature 800° C. in a medium of tungsten hexafluoride ($WF_6$) and hydrogen ($H_2$) at ratio 0.11 for 5 min and then in a medium of $WF_6$, $H_2$ and propane ($C_3H_8$) at a ratio of $WF_6$ to $H_2$ equal to 0.11 and a ratio of $C_3H_8$ to $H_2$ equal to 1.6 for 60 min; the $C_3H_8$ was activated beforehand at 840° C. and the reaction mixture pressure is 8.8 kPa. The material obtained with stainless steel (Kh18N10T) as the base material has an intermediate 10-µm-thick nickel layer and a composite coating with an internal tungsten (W) layer of thickness 5 µm and an external layer (mixture of WC and free carbon) of thickness 35 µm. The microhardness of the coating is 1150 kG/mm².

Example 3

A sample made from stainless steel (Kh18N10T) with a layer of nickel of thickness 7 µm deposited on it by the electrochemical method is retained in a furnace at temperature 700° C. in a medium of tungsten hexafluoride ($WF_6$) and hydrogen ($H_2$) at ratio 0.085 for 1 min and then in a medium of $WF_6$, $H_2$ and propane ($C_3H_8$) at a ratio of $WF_6$ to $H_2$ equal to 0.085 and a ratio of $C_3H_8$ to $H_2$ equal to 1.2 for 2.0 min; the $C_3H_8$ is thermally activated beforehand at 770° C. and the reaction mixture pressure is 5.2 kPa.

The construction material thus obtained with stainless steel (Kh18N10T) as the base material has an intermediate 7-µm-thick nickel layer and a composite coating with an internal tungsten (W) layer of thickness 0.7 µm and an external WC layer of thickness 8 µm. The microhardness of the coating is 1900 kG/mm².

Example 4

A sample made from hard alloy (cemented carbide) VK-10 is retained in the reaction chamber at temperature 650° C. in a medium of tungsten hexafluoride ($WF_6$) and hydrogen ($H_2$) at ratio 0.08 for 1 min and then in a medium of $WF_6$, $H_2$ and propane ($C_3H_8$) at a ratio of $WF_6$ to $H_2$ equal to 0.08 and a ratio of $C_3H_8$ to $H_2$ equal to 0.95 for 80 min; the $C_3H_8$ is thermally activated beforehand at 730° C. and the reaction mixture pressure is 8.8 kPa.

The construction material thus obtained with hard alloy (cemented carbide) VK-10 as the base material has a composite coating with an internal tungsten (W) layer of thickness 0.7 µm and an external layer (mixture of $W_2C$ and WC) of thickness 32 µm. The microhardness of the coating is 2800 kG/mm².

Example 5

A sample made from tool steel (3Kh2V8F) with a layer of nickel of thickness 5 µm deposited on it by the electrochemical method is retained in the reaction chamber at temperature 600° C. in a medium of tungsten hexafluoride ($WF_6$) and hydrogen ($H_2$) at ratio 0.08 for 2 min and then in a medium of $WF_6$, $H_2$ and propane ($C_3H_8$) at a ratio of $WF_6$ to $H_2$ equal to 0.08 and a ratio of $C_3H_8$ to $H_2$ equal to 0.80 for 30 min; the $C_3H_8$ is thermally activated beforehand at 700° C. and the reaction mixture pressure is 8.8 kPa. Chemical analysis showed that the fluorine content was $5 \cdot 10^{-2}$ wt %.

The construction material thus obtained with tool steel with a layer of nickel as the base material has a composite coating with an internal tungsten (W) layer of thickness 1.3 µm and an external layer of $W_2C$ of thickness 9.1 µm. The microhardness of the coating is 2800 kG/mm².

Example 6

A sample made from tool steel R18 with a layer of nickel 5 µm thick applied to it by the electrochemical method is retained in the reaction chamber at temperature 550° C. in a mixture of tungsten hexafluoride ($WF_6$) and hydrogen ($H_2$) at ratio 0.057 for 5 min and then in a medium of $WF_6$, $H_2$ and propane ($C_3H_8$) at a ratio of $WF_6$ to $H_2$ equal to 0.057 and a ratio of $C_3H_8$ to $H_2$ equal to 0.67 for 70 min; the $C_3H_8$ is thermally activated beforehand at 640° C. and the reaction mixture pressure is 5.2 kPa. The construction material thus obtained with steel R18 as the base material has an intermediate 5-µm nickel layer and a composite coating with an internal tungsten (W) layer of thickness 3 µm and an external layer (mixture of $W_2C$ and $W_3C$) of thickness 25 µm. The microhardness of the coating is 2950 kG/mm².

Example 7

A sample made from tool steel Kh12F1 with a layer of nickel 7 μm thick applied to it by the electrochemical method is retained in the reaction chamber at temperature 540° C. in a mixture of tungsten hexafluoride ($WF_6$) and hydrogen ($H_2$) at ratio 0.053 for 2 min and then in a medium of $WF_6$, $H_2$ and propane ($C_3H_8$) at a ratio of $WF_6$ to $H_2$ equal to 0.053 and a ratio of $C_3H_8$ to $H_2$ equal to 0.63 for 40 min; the $C_3H_8$ is thermally activated beforehand at 635° C. and the reaction mixture pressure is 28 kPa.

The construction material thus obtained with tool steel Kh12F1 as the base material has a composite coating with a 7 μm nickel layer, then an internal tungsten (W) layer of thickness 1.0 μm and an external $W_3C$ layer of thickness 18 μm. The microhardness of the coating is 3120 kG/mm².

Example 8

A sample made from tool steel R6M5 with a layer of nickel 5 μm thick applied to it by the electrochemical method is retained in the reaction chamber at temperature 520° C. in a mixture of tungsten hexafluoride ($WF_6$) and hydrogen ($H_2$) at ratio 0.045 for 5 min and then in a medium of $WF_6$, $H_2$ and propane ($C_3H_8$) at a ratio of $WF_6$ to $H_2$ equal to 0.045 and a ratio of $C_3H_8$ to $H_2$ equal to 0.60 for 180 min; the $C_3H_8$ is thermally activated beforehand at 610° C. and the reaction mixture pressure is 42 kPa.

The construction material thus obtained with tool steel R6M5 as the base material has an intermediate 5 μm nickel layer, and a composite coating with an internal tungsten (W) layer of thickness 3 μm and an external layer (mixture of $W_3C$ and $W_{12}C$) of thickness 100 μm. The microhardness of the coating is 3400 kG/mm².

Example 9

A sample made from tool steel 3Kh2V8F with a layer of nickel 5 μm thick applied to it by the electrochemical method is retained in the reaction chamber at temperature 520° C. in a mixture of tungsten hexafluoride ($WF_6$) and hydrogen ($H_2$) at ratio 0.044 for 2 min and then in a medium of $WF_6$, $H_2$ and propane ($C_3H_8$) at a ratio of $WF_6$ to $H_2$ equal to 0.044 and a ratio of $C_3H_8$ to $H_2$ equal to 0.4 for 160 min; the $C_3H_8$ is thermally activated beforehand at 600° C. and the reaction mixture pressure is 28 kPa.

The construction material thus obtained with tool steel 3Kh2V8F as the base material has an intermediate 5 μm nickel layer, and a composite coating with an internal tungsten (W) layer of thickness 1 μm and an external $W_{12}C$ layer of thickness 78 μm. The microhardness of the coating is 3500 kG/mm².

Example 10

A sample made from stainless steel 2Kh13 with a layer of nickel 10 μm thick applied to it by the electrochemical method is retained in the reaction chamber at temperature 520° C. in a mixture of tungsten hexafluoride ($WF_6$) and hydrogen ($H_2$) at ratio 0.070 for 4 min and then in a medium of $WF_6$, $H_2$ and propane ($C_3H_8$) at a ratio of $WF_6$ to $H_2$ equal to 0.070 and a ratio of $C_3H_8$ to $H_2$ equal to 0.20 for 60 min; the $C_3H_8$ is thermally activated beforehand at 650° C. and the reaction mixture pressure is 8.8 kPa.

The construction material thus obtained with stainless steel 2Kh13 as the base material has a composite coating with an internal tungsten (W) layer of thickness 3.8 μm and an external layer (mixture of $W_{12}C$ and W) of thickness 20 μm. The microhardness of the coating is 2150 kG/mm².

Example 11

A sample made from "Monel" alloy is retained in the reaction chamber at temperature 580° C. in a mixture of tungsten hexafluoride ($WF_6$) and hydrogen ($H_2$) at ratio 0.085 for 3 min and then in a medium of $WF_6$, $H_2$ and propane ($C_3H_8$) at a ratio of $WF_6$ to $H_2$ equal to 0.085 and a ratio of $C_3H_8$ to $H_2$ equal to 0.80 for 60 min; the $C_3H_8$ is thermally activated beforehand at 680° C. and the reaction mixture pressure is 8.8 kPa.

The construction material thus obtained with "Monel" alloy as the base material has a composite coating with an internal tungsten (W) layer of thickness 3.5 μm and an external layer (mixture of $W_2C$ and W) of thickness 35 μm. The microhardness of the coating is 1740 kG/mm².

Example 12

A sample made from Invar alloy K6N38F is retained in the reaction chamber at temperature 590° C. in a mixture of tungsten hexafluoride ($WF_6$) and hydrogen ($H_2$) at ratio 0.063 for 3 min and then in a medium of $WF_6$, $H_2$ and propane ($C_3H_8$) at a ratio of $WF_6$ to $H_2$ equal to 0.063 and a ratio of $C_3H_8$ to $H_2$ equal to 0.63 for 40 min; the $C_3H_8$ is thermally activated beforehand at 630° C. and the reaction mixture pressure is 8.8 kPa.

The construction material thus obtained with Invar alloy K6N38F as the base material has a composite coating with an internal tungsten (W) layer of thickness 3 μm and an external layer (mixture of $W_3C$ and W) of thickness 19 μm. The microhardness of the coating is 1690 kG/mm².

Example 13

A sample made from a cake of natural diamonds is retained in the reaction chamber at temperature 520° C. in a mixture of tungsten hexafluoride ($WF_6$) and hydrogen ($H_2$) at ratio 0.048 for 1 min and then in a medium of $WF_6$, $H_2$ and propane ($C_3H_8$) at a ratio of $WF_6$ to $H_2$ equal to 0.048 and a ratio of $C_3H_8$ to $H_2$ equal to 0.65 for 48 min; the $C_3H_8$ is thermally activated beforehand at 700° C. and the reaction mixture pressure is 42 kPa.

The construction material thus obtained with a cake of natural diamonds as the base material has a composite coating with an internal tungsten (W) layer of thickness 0.8 μm and an external layer (mixture of $W_2C$ and $W_{12}C$) of thickness 12 μm. The microhardness of the coating is 3220 kG/mm².

Example 14

A sample made from Nichrome alloy is retained in the reaction chamber at temperature 560° C. in a mixture of tungsten hexafluoride ($WF_6$) and hydrogen ($H_2$) at ratio 0.070 for 8 min and then in a medium of $WF_6$, $H_2$ and propane ($C_3H_8$) at a ratio of $WF_6$ to $H_2$ equal to 0.070 and a ratio of $C_3H_8$ to $H_2$ equal to 0.2 for 40 min; the $C_3H_8$ is thermally activated beforehand at 650° C. and the reaction mixture pressure is 5.2 kPa.

The construction material thus obtained with Nichrome alloy as the base material has a composite coating with an internal tungsten (W) layer of thickness 7 μm and an external layer (mixture of W and C) of thickness 41 μm. The microhardness of the coating is 1210 kG/mm².

Examples of Alternating Layers

Example 15

A sample made from hard alloy (cemented carbide) VK6 is retained in the reaction chamber at temperature 620° C. (a)

in a mixture of tungsten hexafluoride (WF$_6$) and hydrogen (H$_2$) at ratio 0.08 for 2 min and then (b) in a medium of WF$_6$, H$_2$ and propane (C$_3$H$_8$) at a ratio of WF$_6$ to H$_2$ equal to 0.08 and a ratio of C$_3$H$_8$ to H$_2$ equal to 1.5 for 16 min; the C$_3$H$_8$ is thermally activated beforehand at 750° C. and the reaction mixture pressure is 5.2 kPa. Operations (a) and (b) are repeated four times in succession. The fluorine content in the multilayer coating is 9·10$^{-3}$ wt %.

The construction material thus obtained with hard alloy (cemented carbide) VK6 as the base material has a composite coating with four alternating layers of W with thickness 3.0 μm and of WC with thickness 7.0 μm at a ratio of thicknesses 1:2.3 and total thickness of the composite coating 40 μm. The average microhardness of the coating is 1320 kG/mm$^2$.

Example 16

A sample made from hard alloy (cemented carbide) VK10 is retained in the reaction chamber at temperature 650° C. (a) in a mixture of tungsten hexafluoride (WF$_6$) and hydrogen (H$_2$) at ratio 0.08 for 1 min and then (b) in a medium of WF$_6$, H$_2$ and propane (C$_3$H$_8$) at a ratio of WF$_6$ to H$_2$ equal to 0.08 and a ratio of C$_3$H$_8$ to H$_2$ equal to 0.95 for 80 min; the C$_3$H$_8$ is thermally activated beforehand at 730° C. and the reaction mixture pressure is 8.8 kPa. Operations (a) and (b) are repeated four times in succession.

The construction material thus obtained with hard alloy (cemented carbide) VK10 as the base material has a composite coating with four alternating layers of W with thickness 0.7 μm and of a mixture of WC and W$_2$C with thickness 32 μm at a ratio of thicknesses 1:45.7 and total thickness of the composite coating 130.8 μm. The average microhardness of the coating is 2200 kG/mm$^2$.

Example 17

A sample made from tool steel 3Kh2V8F with a layer of nickel 5 μm thick deposited on it by the electrochemical method is retained in the reaction chamber at temperature 600° C. (a) in a mixture of tungsten hexafluoride (WF$_6$) and hydrogen (H$_2$) at ratio 0.080 for 2 min and then (b) in a medium of WF$_6$, H$_2$ and propane (C$_3$H$_8$) at a ratio of WF$_6$ to H$_2$ equal to 0.080 and a ratio of C$_3$H$_8$ to H$_2$ equal to 0.7 for 25 min; the C$_3$H$_8$ is thermally activated beforehand at 700° C. and the reaction mixture pressure is 8.8 kPa. Operations (a) and (b) are repeated five times in succession.

The construction material thus obtained with tool steel 3Kh2V8F as the base material has a composite coating with five alternating layers of W with thickness 1.5 μm and W$_2$C with thickness 7.5 μm at a ratio of thicknesses 1:5 and total thickness of the composite coating 45 μm. The average microhardness of the coating is 2340 kG/mm$^2$.

Example 18

A sample made from Invar alloy K6N38F is retained in the reaction chamber at temperature 580° C. (a) in a mixture of tungsten hexafluoride (WF$_6$) and hydrogen (H$_2$) at ratio 0.060 for 5 min and then (b) in a medium of WF$_6$, H$_2$ and propane (C$_3$H$_8$) at a ratio of WF$_6$ to H$_2$ equal to 0.060 and a ratio of C$_3$H$_8$ to H$_2$ equal to 0.70 for 40 min; the C$_3$H$_8$ is thermally activated beforehand at 650° C. and the reaction mixture pressure is 8.8 kPa. Operations (a) and (b) are repeated 12 times in succession.

The construction material thus obtained with Invar alloy K6N38F as the base material has a composite coating with 12 alternating layers of W with thickness 3.0 μm and a mixture of W$_2$C and W$_3$C with thickness 15.1 μm at a ratio of thicknesses 1:5 and total thickness of the composite coating 217 μm. The average microhardness of the coating is 2150 kG/mm$^2$.

Example 19

A sample made from tool steel Kh12F1 with a layer of nickel of thickness 7 μm deposited on it by the electrochemical method is retained in the reaction chamber at temperature 540° C. (a) in a mixture of tungsten hexafluoride (WF$_6$) and hydrogen (H$_2$) at ratio 0.053 for 3 min and then (b) in a medium of WF$_6$, H$_2$ and propane (C$_3$H$_8$) at a ratio of WF$_6$ to H$_2$ equal to 0.053 and a ratio of C$_3$H$_8$ to H$_2$ equal to 0.62 for 27 min; the C$_3$H$_8$ is thermally activated beforehand at 635° C. and the reaction mixture pressure is 28 kPa. Operations (a) and (b) are repeated five times in succession.

The construction material thus obtained with tool steel Kh12F1 as the base material has a composite coating with five alternating layers of W with thickness 5 μm and W$_3$C with thickness 12 μm at a ratio of thicknesses 1:264 and total thickness of the composite coating 85 μm. The average microhardness of the coating is 2250 kG/mm$^2$.

Example 20

A sample made from carbon steel 45 with a layer of nickel of thickness 6 μm deposited on it by the electrochemical method is retained in the reaction chamber at temperature 540° C. (a) in a mixture of tungsten hexafluoride (WF$_6$) and hydrogen (H$_2$) at ratio 0.047 for 9 min and then (b) in a medium of WF$_6$, H$_2$ and propane (C$_3$H$_8$) at a ratio of WF$_6$ to H$_2$ equal to 0.047 and a ratio of C$_3$H$_8$ to H$_2$ equal to 0.55 for 150 min; the C$_3$H$_8$ is thermally activated beforehand at 630° C. and the reaction mixture pressure is 5.2 kPa. Operations (a) and (b) are repeated seven times in succession.

The construction material thus obtained with carbon steel 45 as the base material with an intermediate nickel layer 6 μm thick has a composite coating with seven alternating layers of W with thickness 4 μm and of a mixture of W$_3$C and W$_{12}$C with thickness 44 μm at a ratio of thicknesses 1:11 and total thickness of the composite coating 396 μm. The average microhardness of the coating is 2900 kG/mm$^2$.

Example 21

A sample made from tool steel R6M5 with a layer of nickel of thickness 3 μm deposited on it by the electrochemical method is retained in the reaction chamber at temperature 520° C. (a) in a mixture of tungsten hexafluoride (WF$_6$) and hydrogen (H$_2$) at ratio 0.050 for 8 min and then (b) in a medium of WF$_6$, H$_2$ and propane (C$_3$H$_8$) at a ratio of WF$_6$ to H$_2$ equal to 0.043 and a ratio of C$_3$H$_8$ to H$_2$ equal to 0.35 for 11 min; the C$_3$H$_8$ is thermally activated beforehand at 650° C. and the reaction mixture pressure is 8.8 kPa. Operations (a) and (b) are repeated 11 times in succession.

The construction material thus obtained with tool steel R6M5 as the base material and an intermediate nickel layer 8 μm thick has a composite coating with 11 alternating layers of W and W$_{12}$C both with thickness 5 μm at a ratio of thicknesses 1:1 and total thickness of the composite coating 110 μm. The average microhardness of the coating is 2550 kG/mm$^2$.

Example 22

A sample made from titanium alloy VT1 with a layer of nickel of thickness 1 μm deposited on it by magnetron spraying is retained in the reaction chamber at temperature 600° C. (a) in a mixture of tungsten hexafluoride ($WF_6$) and hydrogen ($H_2$) at ratio 0.045 for 4 min and then (b) in a medium of $WF_6$, $H_2$ and propane ($C_3H_8$) at a ratio of $WF_6$ to $H_2$ equal to 0.045 and a ratio of $C_3H_8$ to $H_2$ equal to 0.65 for 60 min; the $C_3H_8$ is thermally activated beforehand at 600° C. and the reaction mixture pressure is 42 kPa. Operations (a) and (b) are repeated 15 times in succession.

The construction material thus obtained with titanium alloy VT1 as the base material has a composite coating with 15 alternating layers of W with thickness 5.2 μm and of a mixture of $W_2C$ and $W_{12}C$ with thickness 20 μm at a ratio of thicknesses 1:3.8 and total thickness of the composite coating 378 μm. The average microhardness of the coating is 2220 kG/mm$^2$.

Example 23

A sample made from nitride-silicon ceramics is retained in the reaction chamber at temperature 510° C. (a) in a mixture of tungsten hexafluoride ($WF_6$) and hydrogen ($H_2$) at ratio 0.045 for 1 min and then (b) in a medium of $WF_6$, $H_2$ and propane ($C_3H_8$) at a ratio of $WF_6$ to $H_2$ equal to 0.045 and a ratio of $C_3H_8$ to $H_2$ equal to 0.35 for 50 min; the $C_3H_8$ is thermally activated beforehand at 520° C. and the reaction mixture pressure is 42 kPa. Operations (a) and (b) are repeated 12 times in succession. Chemical analysis showed that the fluorine content was $3.0 \cdot 10^{-1}$ wt %.

The construction material thus obtained with nitride-silicon ceramics as the base material has a composite coating with 12 alternating layers of W with thickness 0.7 μm and of a mixture of W and $W_{12}C$ with thickness 16 μm at a ratio of thicknesses 1:22.8 and total thickness of the composite coating 204 μm. The average microhardness of the coating is 2220 kG/mm$^2$.

Example 24

A sample made from titanium alloy VT1 with a layer of nickel of thickness 2 μm deposited on it by magnetron spraying is retained in the reaction chamber at temperature 600° C. (a) in a mixture of tungsten hexafluoride ($WF_6$) and hydrogen ($H_2$) at ratio 0.09 for 3 min and then (b) in a medium of $WF_6$, $H_2$ and propane ($C_3H_8$) at a ratio of $WF_6$ to $H_2$ equal to 0.09 and a ratio of $C_3H_8$ to $H_2$ equal to 0.7 for 40 min; the $C_3H_8$ is thermally activated beforehand at 720° C. and the reaction mixture pressure is 5.2 kPa. Operations (a) and (b) are repeated seven times in succession.

The construction material thus obtained with titanium alloy VT1 as the base material has an intermediate nickel layer 2 μm thick and a composite coating with seven alternating layers of W with thickness 4.2 μm and of a mixture of W and $W_2C$ with thickness 21.5 μm at a ratio of thicknesses 1:5.1 and total thickness of the composite coating 179.9 μm. The average microhardness of the coating is 1830 kG/mm$^2$.

Example 25

A sample made from tool steel 3Kh3M3F with a layer of nickel of thickness 6 μm deposited on it by the electrochemical method is retained in the reaction chamber at temperature 500° C. (a) in a mixture of tungsten hexafluoride ($WF_6$) and hydrogen ($H_2$) at ratio 0.055 for 3 min and then (b) in a medium of $WF_6$, $H_2$ and propane ($C_3H_8$) at a ratio of $WF_6$ to $H_2$ equal to 0.055 and a ratio of $C_3H_8$ to $H_2$ equal to 0.65 for 120 min; the $C_3H_8$ is thermally activated beforehand at 560° C. and the reaction mixture pressure is 8.8 kPa. Operations (a) and (b) are repeated four times in succession.

The construction material thus obtained with tool steel 3Kh3M3F as the base material has a composite coating with four alternating layers of W with thickness 3.8 μm and of a mixture of W and $W_3C$ with thickness 44.1 μm at a ratio of thicknesses 1:11.6 and total thickness of the composite coating 191.6 μm. The average microhardness of the coating is 1320 kG/mm$^2$.

Industrial Applicability

The invention can be used for strengthening tools made from steel, hard alloy (cemented carbide) or diamond which are used for processing materials by means of cutting or pressing. The latter is the most promising field for applications of the proposed technology due to the absence of competing coating technologies applicable to the manufacture of press tools of complex shape for drawing wires and tubes and for extruding profile sections from aluminium, copper, steel and other metals and alloys. The carbon-tungsten coatings referred to can be deposited on tools and casting moulds used for moulding items from plastics, silicate masses and other abrasive mixtures.

The invention can also be applied for the deposition of erosion resistant coatings on turbine blades, and nozzles for water-jet cutting, surface treatment, rock washing etc. The invention is promising for mechanical engineering in the production of automobiles, tractors, roadmaking machines and other mechanisms in which high wear resistance of friction components is essential. A high economic effect can be expected from the deposition of these coatings on the pressing tools (punches, dies etc.) used in mechanical engineering.

Many items of oil and gas equipment (ground-level pumps, immersion pumps, Christmas tree accessories etc.) can be significantly improved by means of the deposition of wear and corrosion resistant coatings obtained in accordance with this invention.

What is claimed is:

1. Material for wear, erosion and corrosion resistant coatings, consisting of tungsten carbide alloyed with fluorine in amounts ranging from 0.0005 to 0.5 wt %.

2. Material in accordance with claim 1, wherein the said material is tungsten monocarbide WC alloyed with fluorine in amounts ranging from 0.0005 to 0.5 wt %.

3. Material in accordance with claim 1, wherein the said material is tungsten semicarbide $W_2C$ alloyed with fluorine in amounts ranging from 0.0005 to 0.5 wt %.

4. Material in accordance with claim 1, wherein the said material is tungsten subcarbide $W_3C$ alloyed with fluorine in amounts ranging from 0.0005 to 0.5 wt %.

5. Material in accordance with claim 1, wherein the said material is tungsten subcarbide $W_{12}C$ alloyed with fluorine in amounts ranging from 0.0005 to 0.5 wt %.

6. Material in accordance with claim 1, wherein the said material additionally contains fluorocarbon compositions with carbon content up to 15 wt % and fluorine content up to 0.5 wt %.

7. Coating in accordance with claim 6, characterized in that its outer layer additionally contains a mixture of at least two tungsten carbides alloyed with fluorine in amounts ranging from 0.0005 to 0.5 wt % and possible with fluorocarbon compositions with carbon content up to 15 wt % and fluorine content up to 0.5 wt %.

8. Coating, characterized in that it contains:
an internal layer consisting of tungsten deposited on a substrate;
and an external layer deposited on the said internal layer and containing tungsten carbide in accordance with claim 1.

9. Coating in accordance with claim 8, characterized in that its outer layer additionally contains tungsten.

10. Coating in accordance with claim 8, characterized in that its outer layer additionally contains carbon.

11. Coating in accordance with any of claim 8, characterized in that its internal layer has a thickness of 0.5–300 μm and its outer layer has a thickness of 0.5–300 μm, with the ratio of thicknesses of the internal and external layers ranging from 1:1 to 1:600.

12. Multilayer coating made from alternating layers of tungsten and layers containing tungsten carbide in accordance with claim 1.

13. Multilayer coating in accordance with claim 12, characterized in that the thickness of its individual layers ranges from 2 to 10 μm and the ratio of the thicknesses of the alternating layers ranges from 1:1 to 1:5.

14. Material for wear, erosion and corrosion resistant coatings comprising a mixture of at least two tungsten carbides alloyed with fluorine in amounts ranging from 0.0005 to 0.5 wt % and possibly with fluorocarbon compositions with carbon content up to 15 wt % and fluorine content up to 0.5 wt %.

15. Multilaminar coating made from alternating layers of tungsten and layers containing tungsten carbide in accordance with claim 14.

16. Process for producing tungsten carbides by chemical vapour deposition on a heated substrate using a mixture of gases including tungsten hexafluoride, hydrogen, a carbon-containing gas and, optionally, an inert gas, characterized in that the carbon-containing gas is thermally activated beforehand by heating to temperature 500–850° C.

17. Process in accordance with claim 16, characterized in that the said carbon-containing gas is propane.

18. Process in accordance with claim 16, characterized in that it is performed at a pressure of 2–150 kPa, substrate temperature 400–900° C., ratio of carbon-containing gas to hydrogen 0.2–1.7 and ratio of tungsten hexafluoride to hydrogen 0.02–0.12.

19. Process in accordance with claim 18, characterized in that it is performed at a ratio of carbon-containing gas to hydrogen 1.0–1.5 and ratio of tungsten hexafluoride to hydrogen 0.08–0.10, and that the carbon-containing gas is heated beforehand to temperature 750–850° C.; in this case, tungsten monocarbide WC is obtained.

20. Process in accordance with claim 18, characterized in that it is performed at a ratio of carbon-containing gas to hydrogen 0.75–0.90 and ratio of tungsten hexafluoride to hydrogen 0.06–0.08, and that the carbon-containing gas is heated beforehand to temperature 600–750° C.; in this case, tungsten semicarbide $W_2C$ is obtained.

21. Process in accordance with claim 18, characterized in that it is performed at a ratio of carbon-containing gas to hydrogen 0.60–0.65 and ratio of tungsten hexafluoride to hydrogen 0.05–0.55, and that the carbon-containing gas is heated beforehand to temperature 560–720° C.; in this case, tungsten subcarbide $W_3C$ is obtained.

22. Process in accordance with claim 18, characterized in that it is performed at a ratio of carbon-containing gas to hydrogen 0.35–0.45 and ratio of tungsten hexafluoride to hydrogen 0.040–0.045, and that the carbon-containing gas is heated beforehand to temperature 500–700° C.; in this case, tungsten subcarbide $W_{12}C$ is obtained.

23. Process in accordance with claim 18, characterized in that it is performed at a ratio of carbon-containing gas to hydrogen 0.90–1.00 and ratio of tungsten hexafluoride to hydrogen 0.07–0.09, and that the carbon-containing gas is heated beforehand to temperature 670–790° C.; in this case, a mixture of the carbides WC and $W_2C$ is obtained.

24. Process in accordance with claim 18, characterized in that it is performed at a ratio of carbon-containing gas to hydrogen 0.70–0.75 and ratio of tungsten hexafluoride to hydrogen 0.055–0.060, and that the carbon-containing gas is heated beforehand to temperature 580–730° C.; in this case, a mixture of the carbides $W_2C$ and $W_3C$ is obtained.

25. Process in accordance with claim 18, characterized in that it is performed at a ratio of carbon-containing gas to hydrogen 0.60–0.65 and ratio of tungsten hexafluoride to hydrogen 0.045–0.060, and that the carbon-containing gas is heated beforehand to temperature 570–700° C.; in this case, a mixture of the carbides $W_2C$ and $W_{12}C$ is obtained.

26. Process in accordance with claim 18, characterized in that it is performed at a ratio of carbon-containing gas to hydrogen 0.45–0.60 and ratio of tungsten hexafluoride to hydrogen 0.40–0.050, and that the carbon-containing gas is heated beforehand to temperature 550–680° C.; in this case, a mixture of the carbides $W_3C$ and $W_{12}C$ is obtained.

27. Process in accordance with claim 18, characterized in that it is performed at a ratio of carbon-containing gas to hydrogen 0.65–0.70 and ratio of tungsten hexafluoride to hydrogen 0.045–0.060, and that the carbon-containing gas is heated beforehand to temperature 570–710° C.; in this case, a mixture of the carbides $W_2C$, $W_3C$ and $W_{12}C$ is obtained.

28. Process in accordance with claim 18, characterized in that it is performed at a ratio of carbon-containing gas to hydrogen 0.70–0.90 and ratio of tungsten hexafluoride to hydrogen 0.08–0.09, and that the carbon-containing gas is heated beforehand to temperature 600–720° C.; in this case, a mixture of the carbide WC and tungsten is obtained.

29. Process in accordance with claim 18, characterized in that it is performed at a ratio of carbon-containing gas to hydrogen 0.70–0.90 and ratio of tungsten hexafluoride to hydrogen 0.08–0.09, and that the carbon-containing gas is heated beforehand to temperature 600–720° C.; in this case, a mixture of the carbides $W_2C$ and tungsten is obtained.

30. Process in accordance with claim 18, characterized in that it is performed at a ratio of carbon-containing gas to hydrogen 0.60–0.65 and ratio of tungsten hexafluoride to hydrogen 0.055–0.070, and that the carbon-containing gas is heated beforehand to temperature 560–700° C.; in this case, a mixture of the carbide $W_3C$ and tungsten is obtained.

31. Process in accordance with claim 18, characterized in that it is performed at a ratio of carbon-containing gas to hydrogen 0.20–0.35 and ratio of tungsten hexafluoride to hydrogen 0.045–0.070, and that the carbon-containing gas is heated beforehand to temperature 500–680° C.; in this case, a mixture of the carbide $W_{12}C$ and tungsten is obtained.

32. Process in accordance with claim 18, characterized in that it is performed at a ratio of carbon-containing gas to hydrogen 0.35–0.60 and ratio of tungsten hexafluoride to hydrogen 0.05–0.07, and that the carbon-containing gas is heated beforehand to temperature 500–680° C.; in this case, a mixture of the carbides $W_3C$, $W_{12}C$ and tungsten is obtained.

33. Process in accordance with claim 18, characterized in that it is performed at a ratio of carbon-containing gas to hydrogen 1.50–1.70 and ratio of tungsten hexafluoride to hydrogen 0.10–0.12, and that the carbon-containing gas is heated beforehand to temperature 750–850° C.; in this case, a mixture of the carbide WC and carbon is obtained.

34. Process for the deposition of coatings consisting of an internal layer of tungsten and an external layer containing tungsten subcarbide $W_{12}C$ on substrates, preferably on construction materials and on items made from them, characterised in that the said process includes the following stages:

(a) placing the substrate in a chemical vapour deposition reactor;

(b) evacuating the reactor;

(c) heating the said substrate;

(d) supplying tungsten hexafluoride and hydrogen to the reactor;

(e) retaining the substrate in the said gaseous medium for the time interval necessary for the formation of the tungsten layer on the substrate;

(f) in addition to the said tungsten hexafluoride and hydrogen, supplying a previously thermally activated carbon-containing gas to the reactor;

(g) retaining the substrate in the gaseous medium formed at stage (f) for the time necessary for the formation of the outer layer containing tungsten carbides and mixtures of them with each other, with tungsten or with free carbon.

35. Process in accordance with claim 34, characterized in that it is performed at a reactor pressure of 2–150 kPa, substrate temperature 400–900° C., ratio of carbon-containing gas to hydrogen 0.2–1.7 and ratio of tungsten hexafluoride to hydrogen 0.02–0.12.

36. Process in accordance with claim 35, characterized in that it is performed at a ratio of the carbon-containing gas to hydrogen 1.00–1.50 and a ratio of tungsten hexafluoride to hydrogen 0.08–0.10, and that the carbon-containing gas is heated beforehand to temperature 750–850° C.; in this case, an external layer containing tungsten monocarbide WC is obtained.

37. Process in accordance with claim 35, characterized in that it is performed at a ratio of the carbon-containing gas to hydrogen 0.75–0.90 and a ratio of tungsten hexafluoride to hydrogen 0.06–0.08, and that the carbon-containing gas is heated beforehand to temperature 600–750° C.; in this case, an external layer containing tungsten semicarbide $W_2C$ is obtained.

38. Process in accordance with claim 35, characterized in that it is performed at a ratio of the carbon-containing gas to hydrogen 0.60–0.65 and a ratio of tungsten hexafluoride to hydrogen 0.050–0.055, and that the carbon-containing gas is heated beforehand to temperature 560–720° C.; in this case, an external layer containing tungsten subcarbide $W_3C$ is obtained.

39. Process in accordance with claim 35, characterized in that it is performed at a ratio of the carbon-containing gas to hydrogen 0.35–0.40 and a ratio of tungsten hexafluoride to hydrogen 0.040–0.045, and that the carbon-containing gas is heated beforehand to temperature 500–700° C.; in this case, an external layer containing tungsten monocarbide $W_{12}C$ is obtained.

40. Process in accordance with claim 35, characterized in that it is performed at a ratio of the carbon-containing gas to hydrogen 0.90–1.00 and a ratio of tungsten hexafluoride to hydrogen 0.07–0.09, and that the carbon-containing gas is heated beforehand to temperature 670–790° C.; in this case, an external layer containing a mixture of the carbides WC and $W_2C$ is obtained.

41. Process in accordance with claim 35, characterized in that it is performed at a ratio of the carbon-containing gas to hydrogen 0.70–0.75 and a ratio of tungsten hexafluoride to hydrogen 0.055–0.060, and that the carbon-containing gas is heated beforehand to temperature 580–730° C.; in this case, an external layer containing a mixture of the carbides $W_2C$ and $W_3C$ is obtained.

42. Process in accordance with claim 35, characterized in that it is performed at a ratio of the carbon-containing gas to hydrogen 0.65–0.70 and a ratio of tungsten hexafluoride to hydrogen 0.045–0.060, and that the carbon-containing gas is heated beforehand to temperature 570–710° C.; in this case, an external layer containing a mixture of the carbides $W_2C$, $W_3C$ and $W_{12}C$ is obtained.

43. Process in accordance with claim 35, characterized in that it is performed at a ratio of the carbon-containing gas to hydrogen 0.60–0.65 and a ratio of tungsten hexafluoride to hydrogen 0.045–0.060, and that the carbon-containing gas is heated beforehand to temperature 570–700° C.; in this case, an external layer containing a mixture of the carbides $W_2C$ and $W_{12}C$ is obtained.

44. Process in accordance with claim 35, characterized in that it is performed at a ratio of the carbon-containing gas to hydrogen 0.40–0.60 and a ratio of tungsten hexafluoride to hydrogen 0.045–0.050, and that the carbon-containing gas is heated beforehand to temperature 550–680° C.; in this case, an external layer containing a mixture of the carbides $W_3C$ and $W_{12}C$ is obtained.

45. Process in accordance with claim 35, characterized in that it is performed at a ratio of the carbon-containing gas to hydrogen 0.70–0.90 and a ratio of tungsten hexafluoride to hydrogen 0.08–0.09, and that the carbon-containing gas is heated beforehand to temperature 600–720° C.; in this case, an external layer containing a mixture of the carbide $W_2C$ and tungsten is obtained.

46. Process in accordance with claim 35, characterized in that it is performed at a ratio of the carbon-containing gas to hydrogen 0.60–0.65 and a ratio of tungsten hexafluoride to hydrogen 0.055–0.070, and that the carbon-containing gas is heated beforehand to temperature 560–700° C.; in this case, an external layer containing a mixture of the carbide $W_3C$ and tungsten is obtained.

47. Process in accordance with claim 35, characterized in that it is performed at a ratio of the carbon-containing gas to hydrogen 0.35–0.60 and a ratio of tungsten hexafluoride to hydrogen 0.050–0.070, and that the carbon-containing gas is heated beforehand to temperature 500–690° C.; in this case, an external layer containing a mixture of the carbides $W_3C$ and $W_{12}C$ with tungsten is obtained.

48. Process in accordance with claim 35, characterized in that it is performed at a ratio of the carbon-containing gas to hydrogen 0.20–0.35 and a ratio of tungsten hexafluoride to hydrogen 0.045–0.070, and that the carbon-containing gas is heated beforehand to temperature 500–680° C.; in this case, an external layer containing a mixture of the carbide $W_{12}C$ and tungsten is obtained.

49. Process in accordance with claim 35, characterized in that it is performed at a ratio of the carbon-containing gas to hydrogen 0.70–0.90 and a ratio of tungsten hexafluoride to hydrogen 0.08–0.09, and that the carbon-containing gas is heated beforehand to temperature 600–720° C.; in this case, an external layer containing a mixture of the carbide WC and tungsten is obtained.

50. Process in accordance with claim 34, characterized in that, before the application of a coating to materials or items made from materials selected from a group including iron, carbon steels, stainless steels, cast irons, titanium alloys and hard alloys containing titanium, a coating is applied to them consisting of materials which are chemically resistant to hydrogen fluoride, namely nickel, cobalt, copper, silver, gold, platinum, iridium, tantalum, molybdenum and alloys, compounds and mixtures of these, by electrochemical or chemical precipitation from aqueous solutions, electrolysis of melts or physical and chemical vapour precipitation.

51. Process in accordance with any of claim 34, characterized in that the coatings are deposited onto frictional assemblies.

52. Process in accordance with any of claim 34, characterized in that the coatings are deposited onto forming tools used for processing materials by means of pressing.

53. Process in accordance with any of claim 34, characterized in that the coatings are deposited onto components and units of machines and mechanisms operating with compressed gases and liquids or other pneumatic or hydraulic systems.

54. Material comprising:
a substrate made from construction material;
a coating deposited on the said substrate, consisting of an internal tungsten layer and an external layer containing tungsten carbide alloyed with fluorine in amounts ranging from 0.0005 to 0.5 wt % and possibly with fluorocarbon compositions with carbon content up to 15 wt % and fluorine content up to 0.5 wt %.

55. Material in accordance with claim 54, wherein the said tungsten carbide is monocarbide WC.

56. Material in accordance with claim 55, characterized in that the external layer of the said coating additionally contains tungsten.

57. Material in accordance with claim 55, characterized in that the external layer of the said coating additionally contains carbon.

58. Material in accordance with claim 55, characterized in that the internal layer of the said coating has thickness 0.5–300 μm and the ratio of thicknesses of internal and external layers ranges from 1:1 to 1:600.

59. Material according to claim 55, characterized in that the said substrate layer adjacent to the coating contains alloys with nickel content exceeding 25 wt %, e.g. Invar, Nichrome, Monel.

60. Material in accordance with claim 54, wherein the said tungsten carbide is semicarbide $W_2C$.

61. Material in accordance with claim 54, wherein the said tungsten carbide is subcarbide $W_3C$.

62. Material in accordance with claim 54, wherein the said tungsten carbide is subcarbide $W_{12}C$.

63. Material comprising:
a substrate made from construction material;
and a coating deposited on the said substrate, consisting of an internal tungsten layer and an external layer containing a mixture of at least two tungsten carbides alloyed with fluorine in amounts ranging from 0.0005 to 0.5 wt % and possibly with fluorocarbon compositions with carbon content up to 15 wt % and fluorine content up to 0.5 wt %.

64. Material in accordance with claim 63, characterized in that the external layer of the said coating contains a mixture of the tungsten carbides WC and $W_{12}C$.

65. Material in accordance with claim 63, characterized in that the external layer of the said coating contains a mixture of the tungsten carbides $W_3C$ and $W_2C$.

66. Material in accordance with claim 63, characterized in that the external layer of the said coating contains a mixture of the tungsten carbides $W_3C$ and $W_{12}C$.

67. Material in accordance with claim 63, characterized in that the external layer of the said coating contains a mixture of tungsten carbides $W_2C$ and $W_{12}C$.

68. Material in accordance with claim 63, characterized in that the external layer of the said coating contains a mixture of the tungsten carbides $W_2C$, $W_3C$ and $W_{12}C$.

69. Process for the deposition of multilaminar coatings on substrates, preferably on construction materials and items made from them, consisting of alternating layers of tungsten and layers containing tungsten carbide or mixtures of tungsten carbides with each other, with tungsten or with free carbon, said process to include the following stages:
(a) placing the substrate in a chemical vapour deposition reactor;
(b) evacuating the reactor;
(c) heating the said substrate;
(d) supplying tungsten hexafluoride and hydrogen to the reactor;
(e) retaining the substrate in the said gaseous medium for the time interval necessary for the formation of the tungsten layer on the substrate;
(f) in addition to the said tungsten hexafluoride and hydrogen, supplying a previously thermally activated carbon-containing gas to the reactor;
(g) retaining the substrate in the gaseous medium formed at stage (f) for the time necessary for the formation of the outer layer containing tungsten carbide or mixtures of tungsten carbides with each other, with tungsten and with free carbon; stages (d) and (g) are repeated several times in order to form alternating layers of tungsten and layers containing tungsten carbides.

70. Process in accordance with claim 69, characterized in that it is conducted at reactor pressure 2–150 kPa, substrate temperature 400–900° C., ratio of carbon-containing gas to hydrogen 0.2–1.7 and ratio of tungsten hexafluoride to hydrogen 0.02–0.12.

71. Process in accordance with claim 69, characterized in that, before the application of a coating to materials or items made from materials selected from a group including iron, carbon steels, stainless steels, cast irons, titanium alloys and hard alloys containing titanium, a coating is applied to them consisting of materials which are chemically resistant to hydrogen fluoride, namely nickel, cobalt, copper, silver, gold, platinum, iridium, tantalum, molybdenum and alloys, compounds and mixtures of these, by electrochemical or chemical precipitation from aqueous solutions, electrolysis of melts or physical and chemical vapour precipitation.

72. Process in accordance with any of claim 69, characterized in that the coating is deposited onto friction assemblies.

73. Process in accordance with any of claim 69, characterized in that the coating is deposited onto a forming tool used for processing materials by means of pressing.

74. Process in accordance with any of claim 69, characterized in that the coating is deposited onto units of machines and mechanisms operating with compressed gases and liquids or of other pneumatic or hydraulic systems.

75. Construction material comprising a substrate and a multilaminar coating consisting of alternating layers of tungsten and layers containing tungsten carbide alloyed with fluorine in amounts ranging from 0.0005 to 0.5 wt % and possibly with fluorocarbon compositions with carbon content up to 15 wt % and fluorine content up to 0.5 wt %.

76. Material in accordance with claim 75, wherein the said tungsten carbide is tungsten monocarbide WC.

77. Material in accordance with claim 75, wherein the said tungsten carbide is tungsten semicarbide $W_2C$.

78. Material in accordance with claim 75, wherein the said tungsten carbide is tungsten subcarbide $W_3C$.

79. Material in accordance with claim 75, wherein the said tungsten carbide is tungsten subcarbide $W_{12}C$.

80. Material in accordance with any of claim 75, characterized in that the said carbide layers additionally contain tungsten.

81. Material in accordance with any of claim 75, characterized in that the said carbide layers additionally contain carbon.

82. Materials according to any of claim 75, characterized in that the thickness of its layers ranges from 2 to 10 μm and the ratio of the thicknesses of the alternating layers ranges from 1:1 to 1:5.

83. Construction material comprising a substrate and a multilaminar coating consisting of alternating layers of tungsten and layers containing a mixture of at least two tungsten carbides alloyed with fluorine in amounts ranging from 0.0005 to 0.5 wt % and possibly with fluorocarbon compositions with carbon content up to 15 wt % and fluoride content up to 0.5 wt %.

84. Material in accordance with claim 83, wherein the said carbide layers contain a mixture of tungsten carbides WC and $W_2C$.

85. Material in accordance with claim 83, wherein the said carbide layers contain a mixture of tungsten carbides $W_2C$ and $W_3C$.

86. Material in accordance with claim 83, wherein the said carbide layers contain a mixture of tungsten carbides $W_3C$ and $W_{12}C$.

87. Material in accordance with claim 83, wherein the said carbide layers contain a mixture of tungsten carbides $W_2C$ and $W_{12}C$.

88. Material in accordance with claim 83, wherein the said carbide layers contain a mixture of tungsten carbides $W_2C$, $W_3C$ and $W_{12}C$.

89. Material for wear, erosion and corrosion resistant coatings, consisting of tungsten carbide alloyed with fluorine in amounts ranging from 0.0005 to 0.5 wt %, wherein the material is deposited on a heated substrate by way of chemical vapour deposition in a chemical vapour deposition reactor using a mixture of gases including tungsten hexafluoride, hydrogen, a carbon-containing gas and, optionally, an inert gas, and wherein the carbon-containing gas is heated to a temperature of 500 to 850° C. prior to being supplied to the reactor.

90. Material in accordance with claim 89, wherein the said material is tungsten monocarbide WC alloyed with fluorine in amounts ranging from 0.0005 to 0.5 wt %.

91. Material in accordance with claim 89, wherein the said material is tungsten semicarbide $W_2C$ alloyed with fluorine in amounts ranging from 0.0005 to 0.5 wt %.

92. Material in accordance with claim 89, wherein the said material is tungsten subcarbide $W_3C$ alloyed with fluorine in amounts ranging from 0.0005 to 0.5 wt %.

93. Material in accordance with claim 89, wherein the said material is tungsten subcarbide $W_{12}C$ alloyed with fluorine in amounts ranging from 0.0005 to 0.5 wt %.

94. Material in accordance with claim 89, wherein the said material additionally contains fluorocarbon compositions with carbon content up to 15 wt % and fluorine content up to 0.5 wt %.

95. Material for wear, erosion and corrosion resistant coatings comprising a mixture of at least two tungsten carbides alloyed with fluorine in amounts ranging from 0.0005 to 0.5 wt % and optionally with fluorocarbon compositions with carbon content up to 15 wt % and fluorine content up to 0.5 wt %, wherein the material is deposited on a heated substrate by way of chemical vapour deposition in a chemical vapour deposition reactor using a mixture of gases including tungsten hexafluoride, hydrogen, a carbon-containing gas and, optionally, an inert gas, and wherein the carbon-containing gas is heated to a temperature of 500 to 850° C. prior to being supplied to the reactor.

96. Coating, characterised in that it contains:
an internal layer consisting of tungsten deposited on a substrate;
and an external layer deposited on the said internal layer and containing tungsten carbide material in accordance with claim 1.

97. Coating in accordance with claim 96, wherein the external layer additionally contains a mixture of at least two tungsten carbides alloyed with fluorine in amounts ranging from 0.0005 to 0.5 wt % and optionally with fluorocarbon compositions with carbon content up to 15 wt % and fluorine content up to 0.5 wt %.

98. Coating in accordance with claim 96, wherein the external layer additionally contains tungsten.

99. Coating in accordance with claim 96, wherein the external layer additionally contains carbon.

100. Coating in accordance with claim 96, wherein the internal layer has a thickness of 0.5–300 $\mu$m and the external layer has a thickness of 0.5–300 $\mu$m, with the ratio of thicknesses of the internal and external layers ranging from 1:1 to 1:600.

101. Process for producing tungsten carbides in a chemical vapour deposition reactor by chemical vapour deposition on a heated substrate using a mixture of gases including tungsten hexafluoride, hydrogen, a carbon-containing gas and, optionally, an inert gas, wherein the carbon-containing gas is thermally activated before being supplied to the reactor by heating to a temperature of 500–850° C., and wherein fluorine is alloyed with the tungsten carbides in amounts ranging from 0.0005 to 0.5 wt %.

102. Process in accordance with claim 101, wherein the said carbon-containing gas is propane.

103. Process in accordance with claim 101, wherein the process is performed at a pressure of 2–150 kPa, a substrate temperature of 400–900° C., a ratio of carbon-containing gas to hydrogen of 0.2–1.7 and a ratio of tungsten hexafluoride to hydrogen of 0.02–0.12.

104. Process in accordance with claim 103, wherein the process is performed at a ratio of carbon-containing gas to hydrogen of 1.0–1.5 and a ratio of tungsten hexafluoride to hydrogen of 0.08–0.10, and wherein the carbon-containing gas is heated to a temperature of 750–850° C. before being supplied to the reactor, and wherein tungsten monocarbide WC is obtained.

105. Process in accordance with claim 103, wherein the process is performed at a ratio of carbon-containing gas to hydrogen of 0.75–0.90 and a ratio of tungsten hexafluoride to hydrogen of 0.06–0.08, and wherein the carbon-containing gas is heated to a temperature of 600–750° C. before being supplied to the reactor, and wherein tungsten semicarbide $W_2C$ is obtained.

106. Process in accordance with claim 103, wherein the process is performed at a ratio of carbon-containing gas to hydrogen of 0.60–0.65 and a ratio of tungsten hexafluoride to hydrogen of 0.05–0.55, and wherein the carbon-containing gas is heated to a temperature of 560–720° C. before being supplied to the reactor, and wherein tungsten subcarbide $W_3C$ is obtained.

107. Process in accordance with claim 103, wherein the process is performed at a ratio of carbon-containing gas to hydrogen of 0.35–0.45 and a ratio of tungsten hexafluoride to hydrogen of 0.040–0.045, and wherein the carbon-containing gas is heated to a temperature of 500–700° C. before being supplied to the reactor, and wherein tungsten subcarbide $W_{12}C$ is obtained.

108. Process in accordance with claim 103, wherein the process is performed at a ratio of carbon-containing gas to hydrogen of 0.90–1.00 and a ratio of tungsten hexafluoride to hydrogen of 0.07–0.09, and wherein the carbon-containing gas is heated to a temperature of 670–790° C. before being supplied to the reactor, and wherein a mixture of the carbides WC and $W_2C$ is obtained.

109. Process in accordance with claim 103, wherein the process is performed at a ratio of carbon-containing gas to hydrogen of 0.70–0.75 and a ratio of tungsten hexafluoride to hydrogen of 0.055–0.060, and wherein the carbon-containing gas is heated to a temperature of 580–730° C. before being supplied to the reactor, and wherein a mixture of the carbides $W_2C$ and $W_3C$ is obtained.

110. Process in accordance with claim 103, wherein the process is performed at a ratio of carbon-containing gas to hydrogen of 0.60–0.65 and a ratio of tungsten hexafluoride to hydrogen of 0.045–0.060, and wherein the carbon-containing gas is heated to a temperature of 570–700° C. before being supplied to the reactor, and wherein a mixture of the carbides $W_2C$ and $W_{12}C$ is obtained.

111. Process in accordance with claim 103, wherein the process is performed at a ratio of carbon-containing gas to hydrogen of 0.45–0.60 and a ratio of tungsten hexafluoride to hydrogen of 0.045–0.050, and wherein the carbon-containing gas is heated to a temperature of 550–680° C. before being supplied to the reactor, and wherein a mixture of the carbides $W_3C$ and $W_{12}C$ is obtained.

112. Process in accordance with claim 103, wherein the process is performed at a ratio of carbon-containing gas to hydrogen of 0.65–0.70 and a ratio of tungsten hexafluoride to hydrogen of 0.045–0.060, and wherein the carbon-containing gas is heated to a temperature of 570–710° C. before being supplied to the reactor, and wherein a mixture of the carbides $W_2C$, $W_3C$ and $W_{12}C$ is obtained.

113. Process in accordance with claim 103, wherein the process is performed at a ratio of carbon-containing gas to hydrogen of 0.70–0.90 and a ratio of tungsten hexafluoride to hydrogen of 0.08–0.09, and wherein the carbon-containing gas is heated to a temperature of 600–720° C. before being supplied to the reactor, and wherein a mixture of the carbide WC and tungsten is obtained.

114. Process in accordance with claim 103, wherein the process is performed at a ratio of carbon-containing gas to hydrogen of 0.70–0.90 and a ratio of tungsten hexafluoride to hydrogen of 0.08–0.09, and wherein the carbon-containing gas is heated to a temperature 600–720° C. before being supplied to the reactor, and wherein a mixture of the carbides $W_2C$ and tungsten is obtained.

115. Process in accordance with claim 103, wherein the process is performed at a ratio of carbon-containing gas to hydrogen of 0.60–0.65 and a ratio of tungsten hexafluoride to hydrogen of 0.055–0.070, and wherein the carbon-containing gas is heated to a temperature of 560–700° C. before being supplied to the reactor, and wherein a mixture of the carbide $W_3C$ and tungsten is obtained.

116. Process in accordance with claim 103, wherein the process is performed at a ratio of carbon-containing gas to hydrogen of 0.20–0.35 and a ratio of tungsten hexafluoride to hydrogen of 0.045–0.070, and wherein the carbon-containing gas is heated to a temperature of 500–680° C. before being supplied to the reactor, and wherein a mixture of the carbide $W_{12}C$ and tungsten is obtained.

117. Process in accordance with claim 103, wherein the process is performed at a ratio of carbon-containing gas to hydrogen of 0.35–0.60 and a ratio of tungsten hexafluoride to hydrogen of 0.05–0.07, and wherein the carbon-containing gas is heated to a temperature of 500–680° C. before being supplied to the reactor, and wherein a mixture of the carbides $W_3C$, $W_{12}C$ and tungsten is obtained.

118. Process in accordance with claim 103, wherein the process is performed at a ratio of carbon-containing gas to hydrogen of 1.50–1.70 and a ratio of tungsten hexafluoride to hydrogen of 0.10–0.12, and wherein the carbon-containing gas is heated to a temperature of 750–850° C. before being supplied to the reactor, and wherein a mixture of the carbide WC and carbon is obtained.

119. Material for wear, erosion and corrosion resistant coatings, the material including tungsten carbide alloyed with fluorine in amounts ranging from 0.0005 to 0.5 wt %, and having a microhardness of at least 3100 kg/mm².

120. Material as claimed in claim 119, having a microhardness of at least 3400 kg/mm².

121. Material as claimed in claim 119, having a microhardness of at least 3500 kg/mm².

* * * * *

UNITED STATES PATENT AND TRADEMARK OFFICE
CERTIFICATE OF CORRECTION

PATENT NO. : 6,800,383 B1
DATED : October 5, 2004
INVENTOR(S) : Lakhotkin et al.

It is certified that error appears in the above-identified patent and that said Letters Patent is hereby corrected as shown below:

Column 20,
Lines 34, 37, 40 and 61, after "with" please delete "any of" therein.
Line 64, after "to" please delete "any of" therein.

Signed and Sealed this

Twenty-second Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,800,383 B1 Page 1 of 1
APPLICATION NO. : 09/913324
DATED : October 5, 2004
INVENTOR(S) : Lakhotkin et al.

It is certified that error appears in the above-identified patent and that said Letters Patent is hereby corrected as shown below:

At Column 16, line 63, please delete "subcarbide $W_{12}C$" and insert --carbide-- therein.

Signed and Sealed this

Third Day of July, 2007

JON W. DUDAS
*Director of the United States Patent and Trademark Office*